United States Patent
Kobae et al.

(10) Patent No.: US 7,356,907 B2
(45) Date of Patent: Apr. 15, 2008

(54) METHOD OF MANUFACTURING A CARRIAGE ASSEMBLY OF A HARD DISK DRIVE

(75) Inventors: Kenji Kobae, Kawasaki (JP); Takashi Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 422 days.

(21) Appl. No.: 10/997,005

(22) Filed: Nov. 24, 2004

(65) Prior Publication Data

US 2006/0012920 A1    Jan. 19, 2006

(30) Foreign Application Priority Data

Jul. 13, 2004    (JP)    ............................ 2004-206089

(51) Int. Cl.
*G11B 5/127* (2006.01)
*H04R 31/00* (2006.01)

(52) U.S. Cl. ............................... 29/603.06; 29/603.03; 29/603.04; 219/68; 219/69; 219/70; 228/175; 228/180.22; 360/245.9; 360/244.2; 360/244.8; 427/127; 427/128

(58) Field of Classification Search ............ 29/603.03, 29/603.04, 603.06; 219/68–70; 228/175, 228/180.22, 219; 360/245.9, 240, 244, 244.2, 360/244.8; 427/127, 128
See application file for complete search history.

(56) References Cited

U.S. PATENT DOCUMENTS 6,171,982 B1 * 1/2001 Sato ........................... 438/795
2004/0110016 A1 * 6/2004 Hamaya et al. ............. 428/472

FOREIGN PATENT DOCUMENTS

JP         02143467 A  *  6/1990
JP         2000277882     10/2000

* cited by examiner

*Primary Examiner*—Paul D. Kim
(74) *Attorney, Agent, or Firm*—Greer, Burns & Crain, Ltd

(57) ABSTRACT

A method of manufacturing a cartridge assembly of a hard disk drive, including a step of forming a part of a wiring circuit into flying leads and a step of forming a coating layer on the respective opposite surfaces of the bonding surfaces of the flying leads, which will be connected to bonding terminals of a flexible printed circuit board. The method also includes a step of placing an ultrasonic tool in contact with the opposite surfaces of the flying leads via the coating layers, and applying ultrasonic vibration from the ultrasonic tool in a state where the flying leads are pressed onto the bonding terminals to ultrasonically bond the flying leads and the bonding terminals together. Additionally, the method includes a step of heating and melting the coating layers to smooth surfaces of the coating layers that have been roughened by contact with the ultrasonic tool during ultrasonic bonding.

9 Claims, 7 Drawing Sheets

METHOD OF MANUFACTURING A CARRIAGE ASSEMBLY OF A HARD DISK DRIVE

BACKGROUND OF THE INVENTION

1. Field of the Invention

The present invention relates to a carriage assembly of a hard disk drive which is provided with a wiring circuit electrically connected to a magnetic head and includes a long tail suspension circuit board where part of the wiring circuit is formed as flying leads and a flexible printed circuit board on which bonding terminals to which the flying leads are bonded are provided, and to a method of manufacturing the carriage assembly.

2. Related Art

In recent years, in the field of hard disk drives (magnetic disk apparatuses), as the recording density of magnetic disks has increased and access speeds have become faster, the construction of a carriage assembly, and in particular the constructions of the suspension and flexible printed circuit board have been rationalized.

More specifically, "suspension circuit boards", where a wiring circuit is formed in advance on the surface or another part of the suspension that supports a magnetic head, are becoming more common. In addition, to improve the bonding reliability by reducing the number of electrical bonds, it is increasingly common to use a so-called "long tail suspension circuit board" where the suspension circuit board extends as far as the flexible printed circuit board for a preamp provided on the carriage assembly and to directly bond the wiring circuit of the suspension circuit board and the flexible printed circuit board for the preamp to one another without a trunk cable or the like in between.

FIG. 3 is a side elevation of a carriage assembly C in which the long tail suspension circuit board described above is used.

A carriage main body 10 of the carriage assembly C includes a plurality of carriage arms 10a that extend corresponding to recording surfaces of a plurality of magnetic disks (not shown) that are disposed in parallel. Seek operations within planes that are parallel with the surfaces of the magnetic disks are carried out by rotating the carriage main body 10 by rotating an actuator shaft that has a rotational axis on the line A-A in FIG. 3.

Long tail suspension circuit boards 12 are formed as thin stainless steel plates, are disposed inside channels 10b formed along the extending direction of the carriage arms 10a, and are attached to the carriage main body 10. End parts 12a of the long tail suspension circuit boards 12 protrude from and beyond ends of the carriage arms 10a, and magnetic heads 14 are mounted on surfaces of the end parts 12a that face the magnetic disks.

A flexible printed circuit board 16 for a preamp is attached to a reinforced part on one side surface of the carriage main body 10. The flexible printed circuit board 16 is attached to the reinforced part of the carriage main body 10 by an adhesive applied to the reinforced part and a screw 18.

FIG. 4A is a plan view of a long tail suspension circuit board 12.

A wiring circuit 15 that is made of a conductive material such as copper and is electrically connected to a magnetic head 14 is provided on one surface of the long tail suspension circuit board 12. The wiring circuit 15 is provided from a front end 12a, on which the magnetic head 14 is mounted, to the other end on the carriage main body 10 side and is provided along the length of the long tail suspension circuit board 12.

The wiring circuit 15 is normally provided with two signal lines for writes onto a magnetic disk by the magnetic head 14 and two signal lines for reads, making a total of four signal lines.

The front and rear surfaces of the wiring circuit 15 (i.e., a surface facing the thin stainless steel plate described above and an outer surface) are insulated by being covered with an insulating film, such as a polyimide film.

However, at the other end of the long tail suspension circuit board 12, the wiring circuit 15 is formed of flying leads 15a (parts shaded black in FIG. 8B) that are completely exposed from the thin stainless steel plate described above and the insulating film (see FIG. 3 of Patent Document 1).

The flying leads 15a are bonding terminals on the long tail suspension circuit board 12 for bonding to bonding terminals 16a of the flexible printed circuit board 16 for the preamp.

FIG. 5 is an enlargement of bonded parts of the bonding terminals 16a and the flying leads 15a.

In order to make the direction in which the respective flying leads 15a are aligned parallel with the printed circuit surface of the flexible printed circuit board 16, a part 12b at the other end of the long tail suspension circuit board 12 is bent at a right angle at the line B-B in FIG. 4B so that the formation surface of the wiring circuit 15 is on the inside, with the flying leads 15a being bonded to the bonding terminals 16a.

FIGS. 6A to 6E show a conventional method of manufacturing the carriage assembly C. These drawings are cross-sectional views in the lengthwise direction of the flying leads 15a at the flying leads 15a end of the long tail suspension circuit board 12.

As shown in FIG. 6A, at the other end of the long tail suspension circuit board 12, the stainless steel plate 28 and the insulating film 26 are removed to expose part of the wiring circuit 15, thereby forming the flying leads 15a.

Next, as shown in FIG. 6B, a gold plating layer 20 is provided on a copper core of the flying leads 15a. It should be noted that as shown in FIG. 3 and in Paragraphs 0025 and 0026 of Patent Document 1, a nickel plating layer may be formed between the core of the flying leads 15a and the gold plating layer 20.

As shown in FIG. 6C, the bonding terminals 16a of the flexible printed circuit board 16 are also constructed by forming a gold plating layer 21 on an upper layer of a copper core. An ultrasonic tool T is placed in contact with the flying leads 15a and the flying leads 15a are pressed onto the bonding terminals 16a by the ultrasonic tool T. In this state, by applying ultrasonic vibration to the flying leads 15a using the ultrasonic tool T, the flying leads 15a and the bonding terminals 16a are ultrasonically bonded together.

As shown in FIG. 6D, after the ultrasonic bonding, the surfaces of the flying leads 15a in contact with the ultrasonic tool T become rough due to the friction between the ultrasonic tool T and the contacting surface, so that it is easy for dust to be produced. Dust present inside a hard disk drive can cause the hard disk drive to malfunction, therefore after the ultrasonic bonding, to prevent dust from being produced, as shown in FIGS. 6E and 7, a resin coating 22 is applied to the contact surface of the flying leads 15a so as to span the bonding terminals 16a and the surface of the flexible printed circuit board 16. In this way, the production of dust is prevented.

Patent Document 1

Japanese Laid-Open Patent Publication No. 2003-31915 (FIG. 3, and Paragraphs 0025 and 0026).

On the other hand, during the manufacturing process for a hard disk drive, when a fault is discovered in a test of electrical characteristics and the like of the magnetic heads 14 and the long tail suspension circuit board 12 after the assembly of the carriage assembly C, in some cases a replacement process for the long tail suspension circuit board 12 becomes necessary.

In this case, it is necessary to pull the flying leads 15a off the bonding terminals 16a, but as shown in FIGS. 6E and 7, if the resin coating 22 that spans the bonding terminals 16a and the surface of the flexible printed circuit board 16 is applied onto the contact surfaces of the flying leads 15a, it will be necessary to apply, to the flying leads 15a, not only enough force to pull the flying leads 15a off the bonding terminals 16a but also enough force to pull the resin coating 22 off the bonding terminals 16a and the surface of the flexible printed circuit board 16. This means that there are cases where the application of a large force to the flying leads 15a causes the flying leads 15a to break, resulting in the problem that replacement becomes difficult or no longer possible. Also, even if the flying leads 15a do not break, residue of the resin coating that is deposited on the bonding terminals 16a gets in the way, resulting in the problem that rebonding of the flying leads 15a becomes difficult or no longer possible.

SUMMARY OF THE INVENTION

The present invention solves the problems described above and it is an object of the present invention to provide a carriage assembly of a hard disk drive and a manufacturing apparatus for the same that are not susceptible to problems such as flying leads breaking and resin residue being deposited on bonding terminals when the flying leads of a long tail suspension circuit board are pulled off the bonding terminals of a flexible printed circuit board.

The present inventors conducted detailed research to solve the above problems and realized the present invention from the idea that instead of coating the flying leads with resin, it is effective to eliminate the roughness of the surfaces of the flying leads that contact the ultrasonic tool and would conventionally produce dust.

To achieve the stated object, a cartridge assembly of a hard disk drive according to the present invention includes: a carriage main body provided so as to be capable of rotating about an actuator shaft; a long tail suspension circuit board which is attached to the carriage main body, on whose end a magnetic head is mounted, and on which a wiring circuit that is electrically connected to the magnetic head is provided, part of the wiring circuit being formed by flying leads; and a flexible printed circuit board which is attached to a reinforced part provided on the carriage main body and on which bonding terminals that are bonded to the flying leads are provided, wherein the flying leads and the bonding terminals are ultrasonically bonded together by placing an ultrasonic tool in contact with respective opposite surfaces of the flying leads on opposite sides to bonding surfaces to be bonded to the bonding terminals and applying ultrasonic vibration from the ultrasonic tool in a state where the flying leads are pressed onto the bonding terminals, and coating layers of a thermally meltable metal that melts at a lower temperature than a material composing the bonding surfaces are formed on the respective opposite surfaces of the flying leads.

In addition, the thermally meltable metal may be solder.

The bonding surfaces of the flying leads may be made of gold.

To achieve the stated object, a method of manufacturing a cartridge assembly of a hard disk drive according to the present invention manufactures a cartridge assembly of a hard disk drive according to Claim 1 and includes: a step of forming the coating layers on the respective opposite surfaces of the flying leads; a step of placing an ultrasonic tool in contact with the opposite surfaces of the flying leads via the coating layers, and applying ultrasonic vibration from the ultrasonic tool in a state where the flying leads are pressed onto the bonding terminals to ultrasonically bond the flying leads and the bonding terminals together; and a step of heating and melting the coating layers to smooth surfaces of the coating layers that have been roughened by contact with the ultrasonic tool during ultrasonic bonding.

The coating layer may be heated and melted by irradiating the coating layer with a laser or by blowing hot air.

After the ultrasonic bonding, the ultrasonic tool may be heated to heat and melt the coating layer.

By doing so, since the ultrasonic tool used to bond the flying leads and the bonding terminals together is heated as it is, there is no need to provide a heating means or the like that is separate to the ultrasonic tool and heats the coating layer, which means that the manufacturing process and manufacturing equipment can be simplified.

Another method according to the present invention is a method of manufacturing a cartridge assembly of a hard disk drive according to any of Claim 1 to Claim 3, including: a step of placing an ultrasonic tool in contact with the opposite surfaces of the flying leads and ultrasonically bonding the flying leads and the bonding terminals together by applying ultrasonic vibration from the ultrasonic tool in a state where the flying leads are pressed onto the bonding terminals; and a step of covering the respective opposite surfaces of the flying leads that have been roughened by contact with the ultrasonic tool during the ultrasonic bonding with the thermally meltable metal that has been heated and melted to form the respective coating layers and thereby make the respective opposite surfaces smooth.

According to the present invention, coating layers (thermally meltable metal) formed on the respective opposite surfaces of the flying leads to the surfaces bonded to the bonding terminals are heated to make the surfaces that contact the ultrasonic tool smooth. Accordingly, it is possible, without applying a resin coating onto the flying leads that would span the flexible printed circuit board and the bonding terminals, to eradicate the roughness of the surfaces of the flying leads that contact the ultrasonic tool and would otherwise produce dust.

Accordingly, when the flying leads are pulled off the bonding terminals, only enough force to pull the flying leads off the bonding terminals 16a acts on the flying leads, and since there is no resin coating, there is no breaking of the flying leads due to a force for pulling the resin coating off the flexible printed circuit board and the bonding terminals 16a acting on the flying leads, and no depositing of resin residue on the bonding terminals. For this reason, in the replacement process for the long tail suspension circuit board, the conventional problem of the rebonding of the flying leads being difficult or impossible is solved.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Figure 1A:
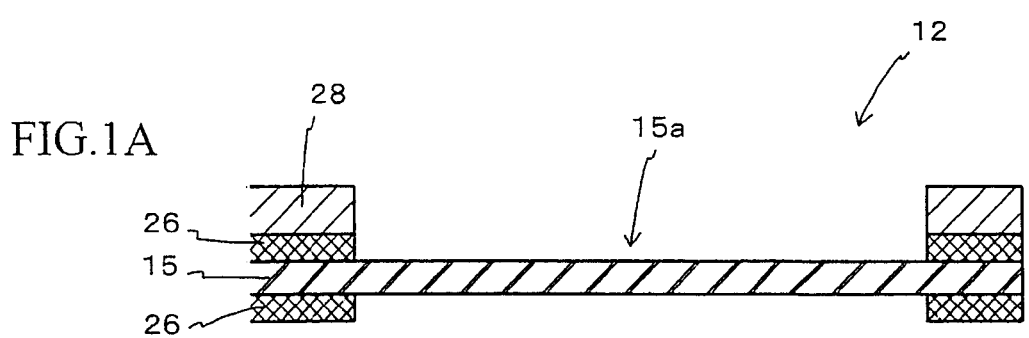
FIGS. 1A to 1E are diagrams useful in explaining a carriage assembly of a hard disk drive according to the present invention and a method of manufacturing the same.

Preferred embodiments of the present invention will now be described with reference to the enclosed drawings.

It should be noted that parts that are the same as in the conventional carriage assembly have been assigned the same reference numerals and description of such has been omitted.

Figure 3:
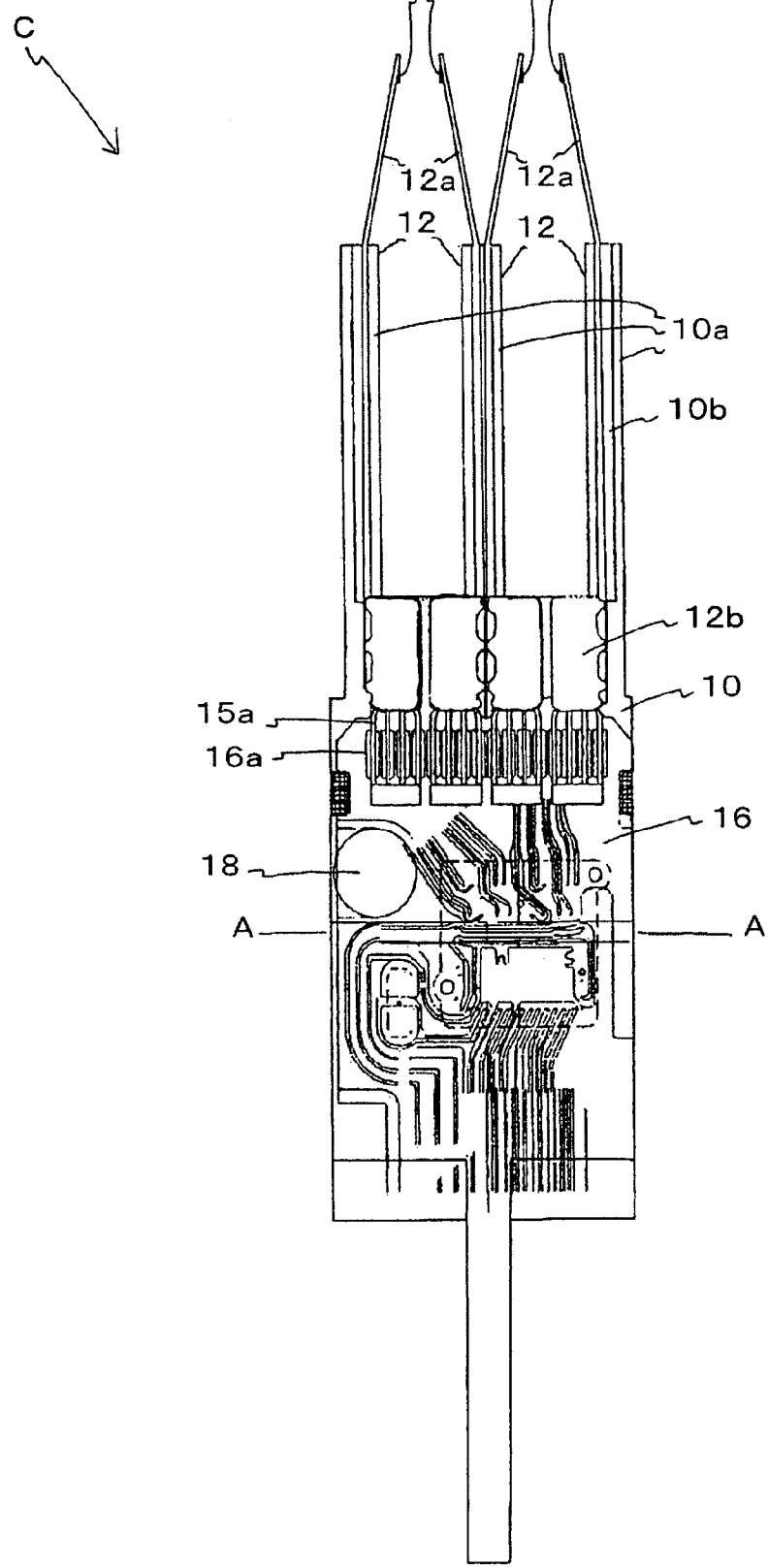
FIG. 3 is a diagram showing the carriage assembly of a hard disk drive.
Figures 4A, 4B:
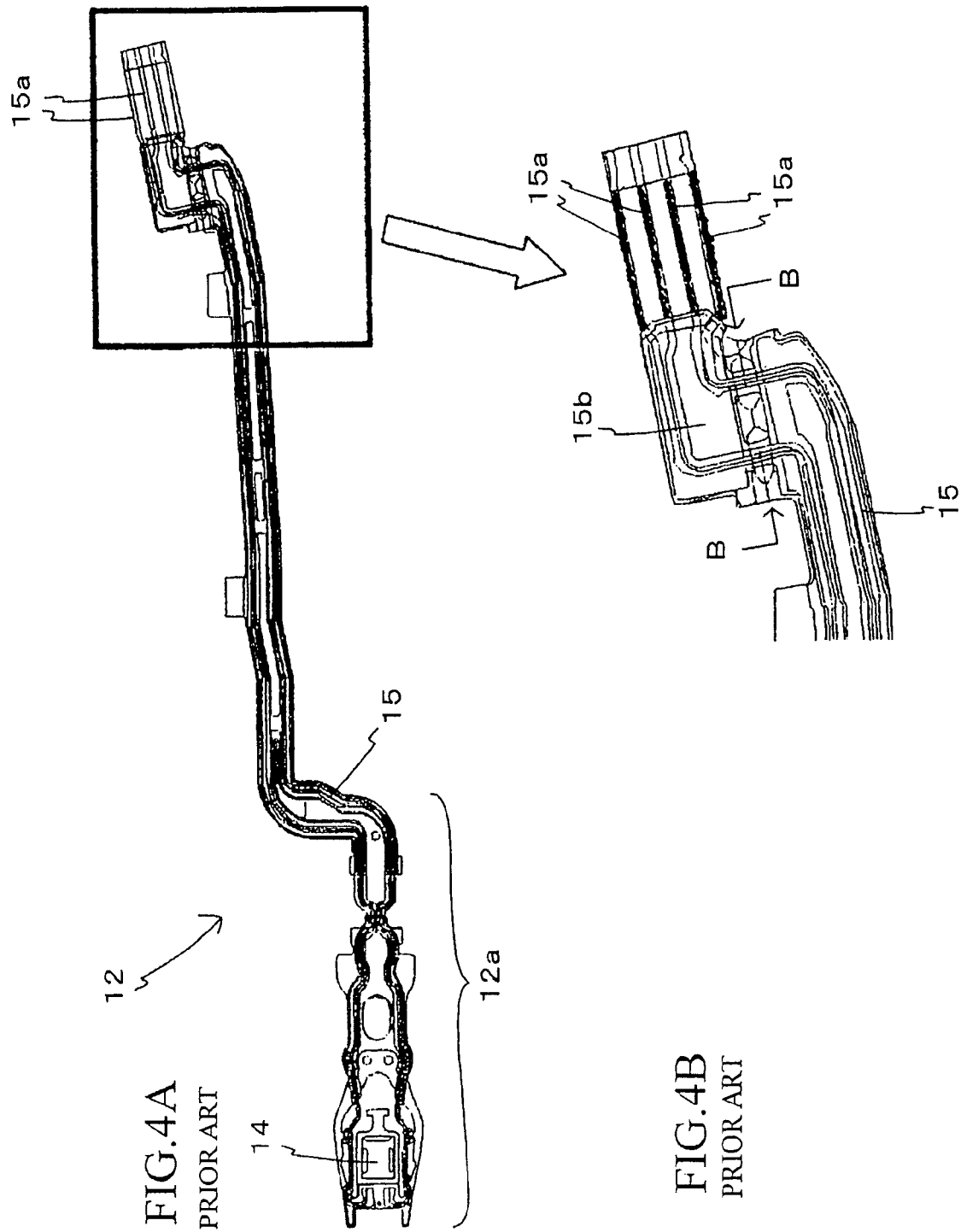
FIGS. 4A and 4B are diagrams showing a long tail suspension circuit board.
Figure 5:
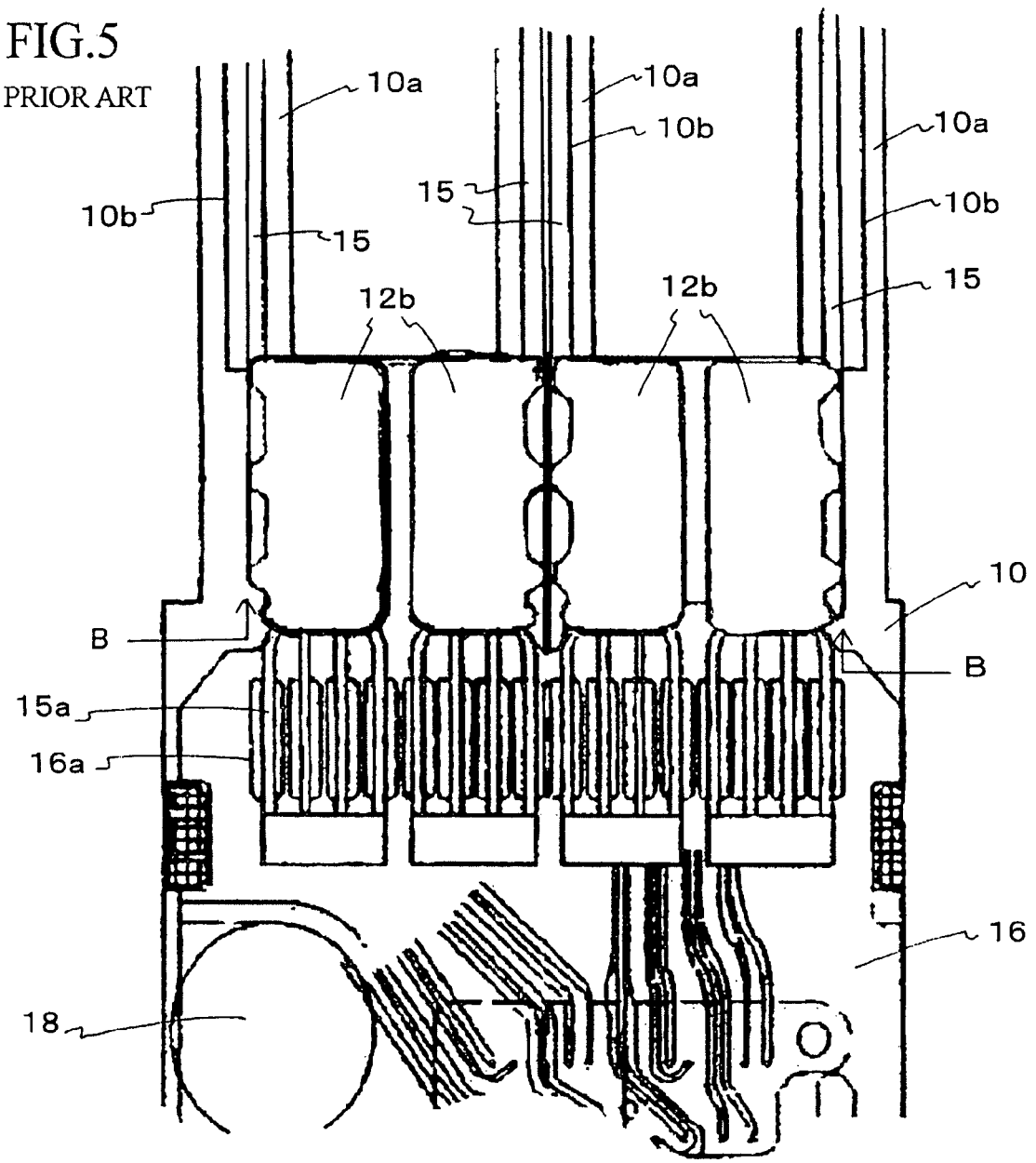
FIG. 5 is an enlargement of bonded parts of the bonding terminals and the flying leads of a carriage assembly.
Figure 6A:
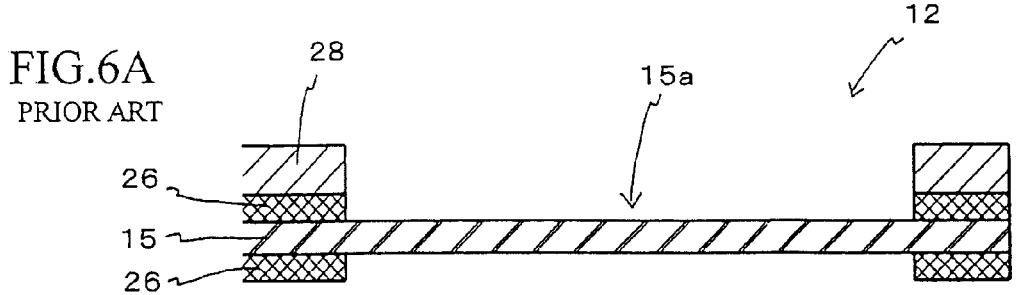
FIGS. 6A to 6E are a series of diagrams useful in explaining the carriage assembly of a conventional hard disk drive and the method of manufacturing the same.
Figure 6B:
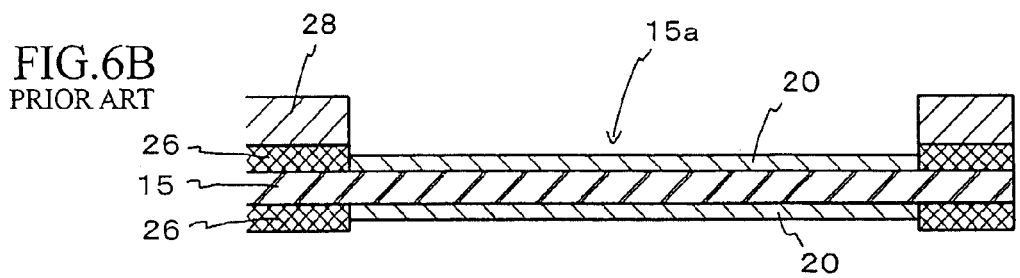
Figure 6C:
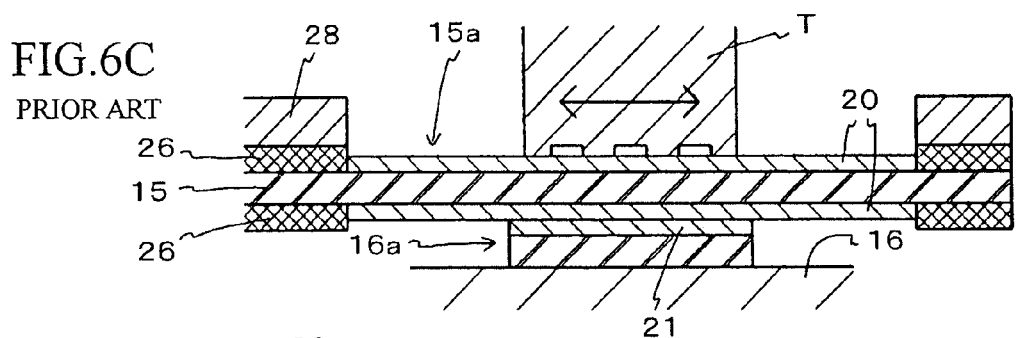
Figure 6D:
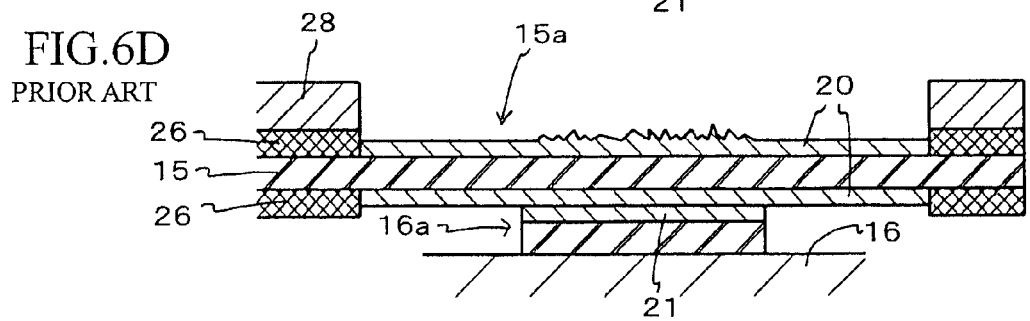
Figure 6E:
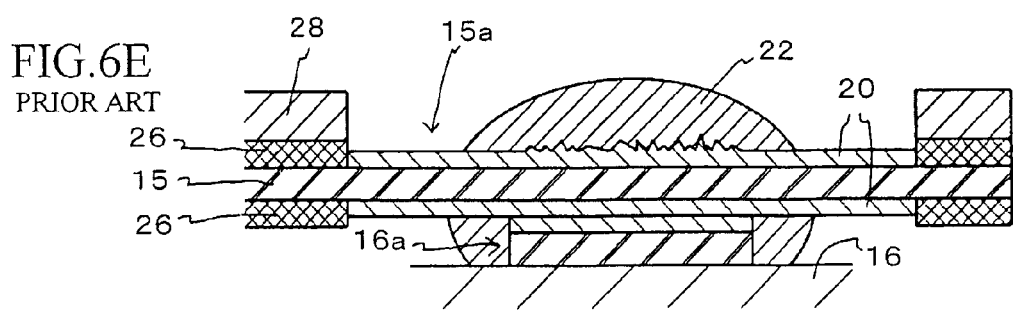
Figure 7:
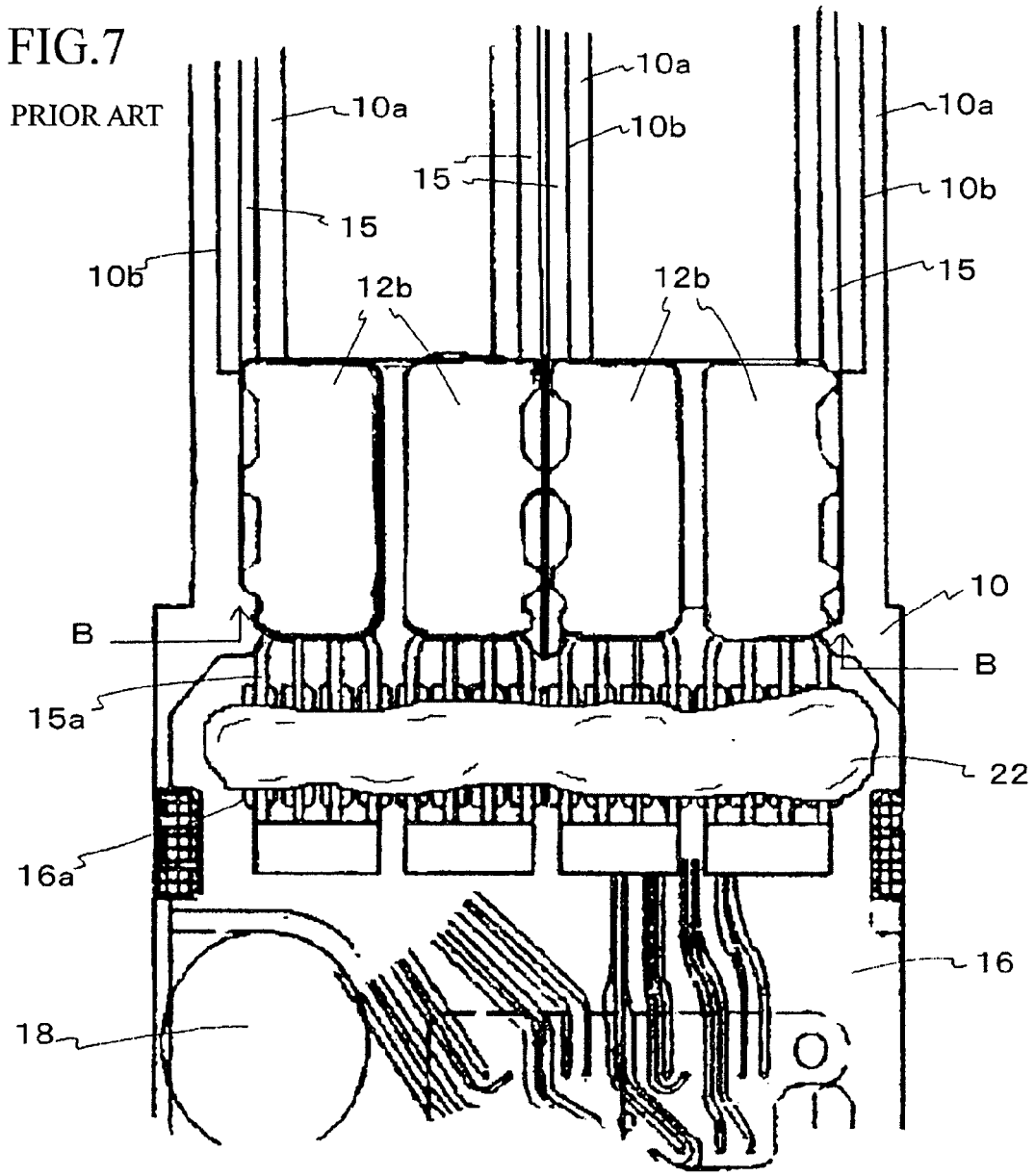
FIG. 7 is an enlargement of bonded parts of the bonding terminals and flying leads of a conventional carriage assembly.

The external appearance and fundamental construction of a carriage assembly according to the present invention and a long tail suspension circuit board of this carriage assembly are the same as the carriage assembly C and the long tail suspension circuit board 12 shown in FIGS. 3 to 5, and therefore description of such has been omitted.

The carriage assembly C according to the present invention is characterized by the construction of the flying leads 15a of the long tail suspension circuit board 12.

FIGS. 1A to 1E are a series of diagrams useful in explaining the carriage assembly C according to the present invention and a method of manufacturing the same, and are cross-sectional views of the flying leads 15a in the lengthwise direction at the flying leads 15a end of the long tail suspension circuit board 12.

As shown in FIG. 1A, at the other end of the long tail suspension circuit board 12, the stainless steel plate 28 and the insulating film 26 are removed to expose part of the wiring circuit 15, thereby forming the flying leads 15a.

Figure 1B:
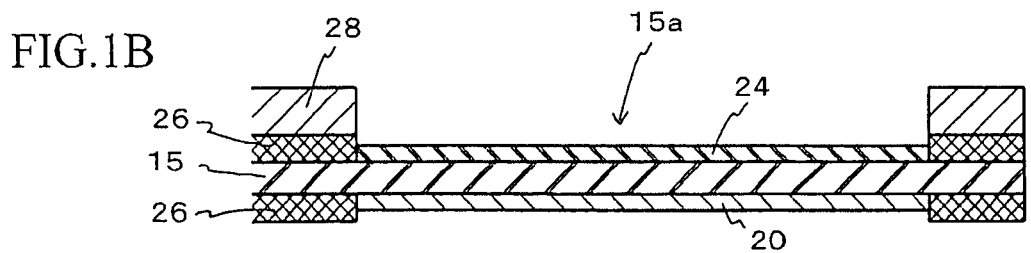

Next, as shown in FIG. 1B, a gold plating layer 20 is provided on a surface of a copper core of the flying leads 15a that is bonded to the bonding terminals 16a of the flexible printed circuit board 16. On the other hand, a coating layer 24 composed of solder plating is provided on the opposite surface of the core of the flying leads 15a to the bonding surface as a thermally meltable metal that melts at a lower temperature than the copper composing the core or the gold composing the gold plating layer 20. It should be noted that a nickel plating layer may be formed between the gold plating layer 20 of the flying leads 15a and the coating layer 24.

Figure 1C:
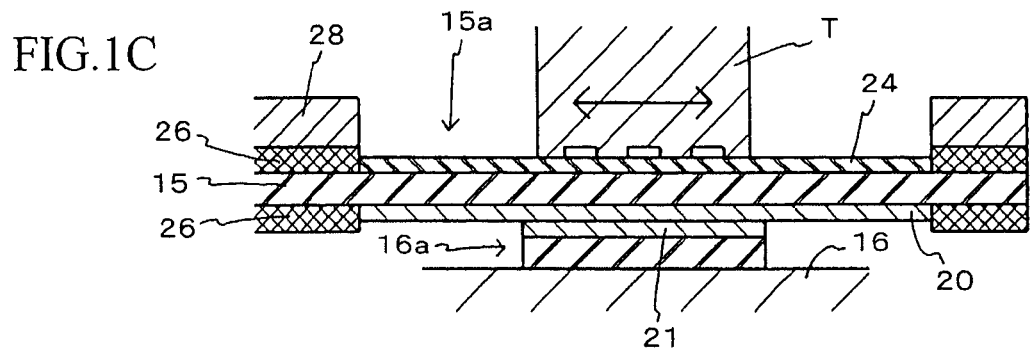

As shown in FIG. 1C, the bonding terminals 16a of the flexible printed circuit board 16 are composed by forming a gold plating layer 21 on an upper layer of a copper core. An ultrasonic tool T is placed in contact with the flying leads 15a and the flying leads 15a are pressed onto the bonding terminals 16a by the ultrasonic tool T. In this state, by applying ultrasonic vibration to the flying leads 15a using the ultrasonic tool T, the flying leads 15a and the bonding terminals 16a are ultrasonically bonded together.

Figure 1D:
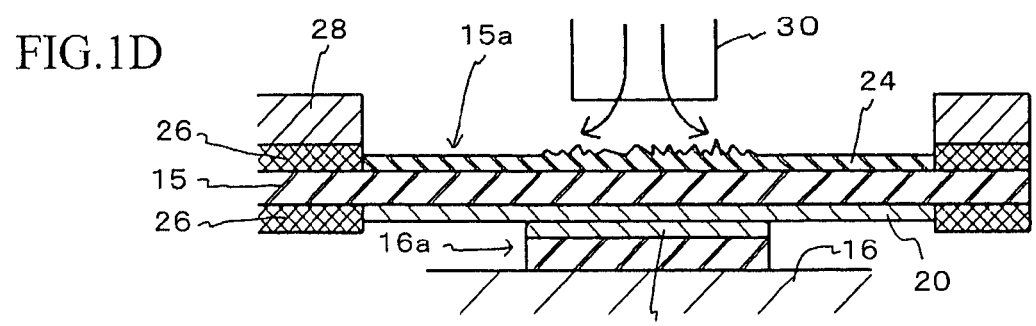

As shown in FIG. 1D, after the ultrasonic bonding, the surface of the flying leads 15a in contact with the ultrasonic tool T (i.e., the surface of the coating layer 24) becomes rough due to the friction between the ultrasonic tool T and the contacting surface, so that it is easy for dust to be produced. Dust present inside a hard disk drive can cause the hard disk drive to malfunction.

Figure 1E:
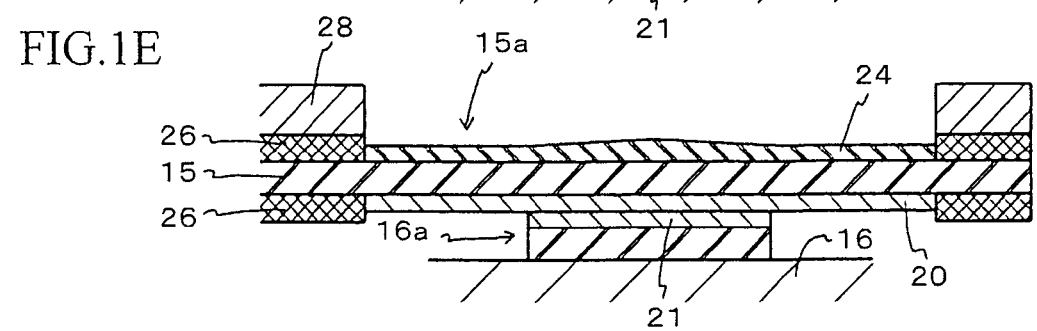

In the present embodiment, hot air is blown from a blower 30 used as a heating means to reflow (melt) the coating layer 24 that is made of solder, so that the surface of the roughened coating layer 24 is made smooth, thereby eliminating the roughness (see FIG. 1E).

With the method of manufacturing a carriage assembly according to the present invention, it is possible to make the surface that contacts the ultrasonic tool T smooth without applying a resin coating that spans a surface of the flexible printed circuit board 16 and the bonding terminals 16a thereof.

Accordingly, when the flying leads 15a are pulled off the bonding terminals 16a, only the force that pulls the flying leads 15a off the bonding terminals 16a acts on the flying leads 15a, and unlike the related art, an excessive force due to the attachment force of a resin coating does not act on the flying leads 15a and cause the flying leads 15a to break, and no residue of a resin coating is deposited on the bonding terminals 16a. This means in a replacement process for the long tail suspension circuit board 12, the conventional problem of it being difficult or impossible to rebond the flying leads 15a is solved.

Figure 2:
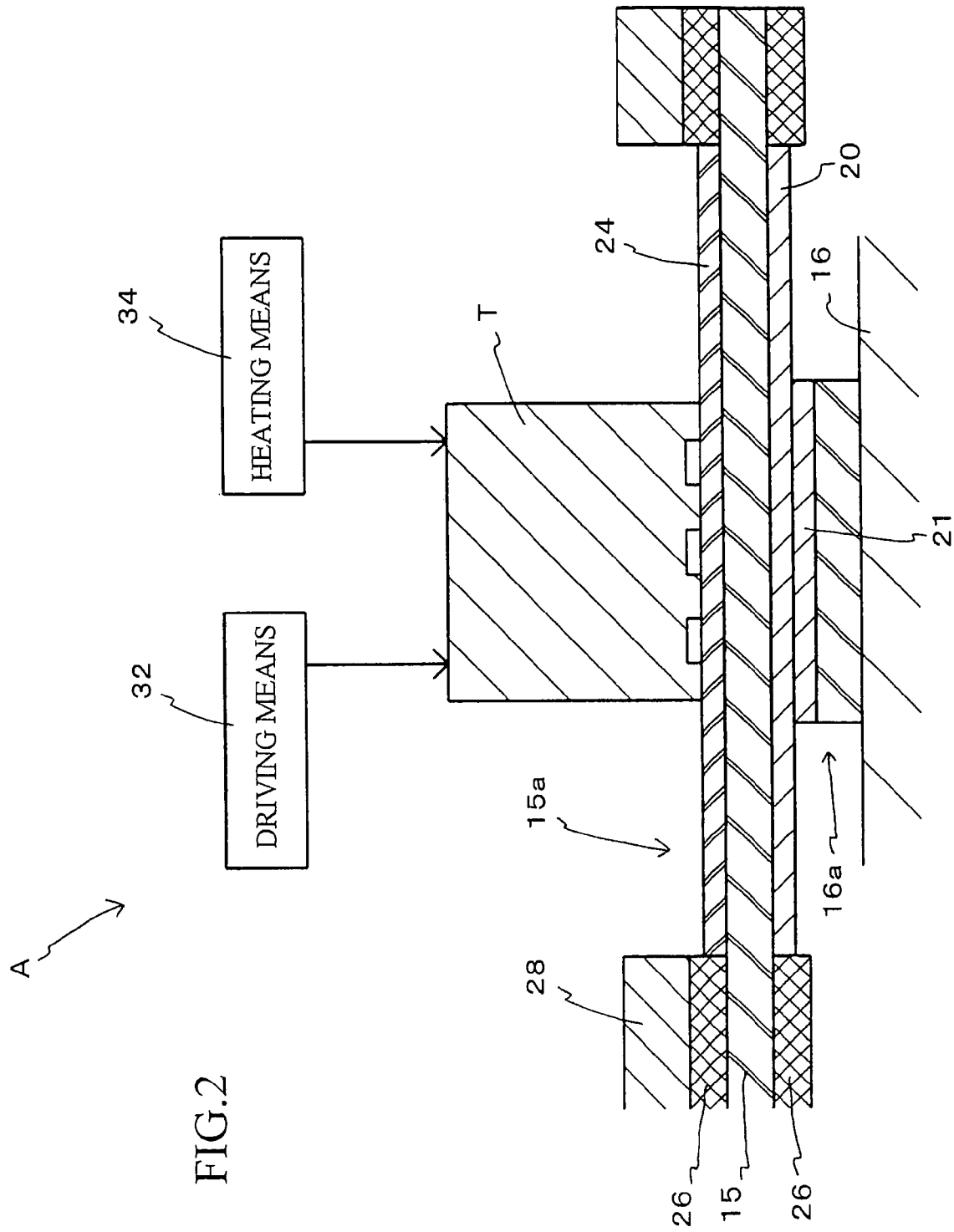
FIG. 2 is a diagram showing a method of manufacturing the carriage assembly of a hard disk drive and a manufacturing apparatus according to the present invention.

It should be noted that the method of heating the coating layer 24 is not limited to a method that blows hot air, and for example, it is possible to heat the coating layer 24 by irradiating the coating layer 24 with laser light or, as shown in FIG. 2, to heat the coating layer 24 using a manufacturing apparatus A for a carriage assembly of a hard disk drive.

The manufacturing apparatus A for the carriage assembly of the hard disk drive shown in FIG. 2 includes the ultrasonic tool T, a driving means 32 that places the ultrasonic tool T in contact with the surface of the flying leads 15a that is opposite the bonding surface and causes the ultrasonic tool T to ultrasonically vibrate in a state where the flying leads 15a are pressed onto the bonding terminals 16a to ultrasonically bond the flying leads 15a and the bonding terminals 16a together, and a heating means 34 that heats the ultrasonic tool T to heat and melt the coating layer 24.

In place of the process that blows hot air in FIG. 1D, the ultrasonic tool T is heated by the heating means 34 in a state where the ultrasonic tool T is in contact with the coating layer 24. The heat of the ultrasonic tool T is transmitted to the coating layer 24 which reflows (melts), resulting in the surface of the roughened coating layer 24 becoming smooth (FIG. 1E).

According to the method of manufacturing that uses the manufacturing apparatus A for the carriage assembly of a hard disk drive shown in FIG. 2, the ultrasonic tool T used to bond the flying leads 15a and the bonding terminals 16a together is heated as it is, so that there is no need to provide a means that is separate to the ultrasonic tool T and heats the coating layer 24, which means that the manufacturing process and manufacturing equipment can be simplified.

Also, instead of forming the coating layer 24 on the flying leads 15a in advance, as disclosed by Claim 8 of the present application, after the ultrasonic bonding, the roughened contact surfaces (the opposite surfaces) of the flying leads 15a that are roughened by contact with the ultrasonic tool T during the ultrasonic bonding may be covered with thermally meltable metal, such as solder that has been heated and melted, to form respective coating layers and thereby make the contact surfaces smooth.

With this method of manufacturing, separate coating layers are formed on the respective flying leads, so that unlike a conventional resin coating which is formed on the flying leads and spans the flexible printed circuit board and the bonding terminals, when the flying leads are pulled off, no excessive force aside from the force that pulls the flying leads 15a off the bonding terminals 16a acts on the flying leads and no residue is produced.

When, as in the related art, coating with resin is carried out, to improve the bonding characteristics of the coating with the metal of the flying leads, it is necessary to use a large amount of resin, and due to the viscosity of the resin, the resin inevitably ends up adhering to regions that span adjacent flying leads.

When the flying leads are coated with a thermally meltable metal, such as solder, there is a favorable wettability since both the flying leads and the coating are made of metal, which means it is possible to coat the individual flying leads using a small amount of metal without spanning a plurality of the flying leads 15a. Accordingly, it is possible to solve the problems of the related art without forming a coating that spans the flying leads and the flexible printed circuit board.

What is claimed is:

1. A method of manufacturing a cartridge assembly of a hard disk drive, comprising:
   a step of forming a part of a wiring circuit, which is electrically connected to a magnetic head mounted on an end of a long tail suspension circuit board, into flying leads;
   a step of forming a coating layer, which is made of a thermally meltable metal whose melting point is lower than that of a material constituting bonding surfaces, on the respective opposite surfaces of the bonding surfaces of the flying leads, which will be connected to bonding terminals of a flexible printed circuit board;
   a step of placing an ultrasonic tool in contact with the opposite surfaces of the flying leads via the coating layers, and applying ultrasonic vibration from the ultrasonic tool in a state where the flying leads are pressed onto the bonding terminals to ultrasonically bond the flying leads and the bonding terminals together; and
   a step of heating and melting the coating layers to smooth surfaces of the coating layers that have been roughened by contact with the ultrasonic tool during ultrasonic bonding.

2. The method of manufacturing a cartridge assembly of a hard disk drive according to claim 1,
   wherein the coating layer is heated and melted by irradiating the coating layer with a laser.

3. The method of manufacturing a cartridge assembly of a hard disk drive according to claim 1,
   wherein the coating layer is heated and melted by blowing hot air.

4. The method of manufacturing a cartridge assembly of a hard disk drive according to claim 1,
   wherein after the ultrasonic bonding, the ultrasonic tool is heated to heat and melt the coating layer.

5. The method according to claim 1, wherein the thermally meltable metal is solder.

6. The method according to claim 1, wherein the bonding surfaces of the flying leads are made of gold.

7. A method of manufacturing a cartridge assembly of a hard disk drive, comprising:
   a step of forming a part of a wiring circuit, which is electrically connected to a magnetic head mounted on an end of a long tail suspension circuit board, into flying leads;
   a step of placing an ultrasonic tool in contact with the opposite surfaces of bonding surfaces of the flying leads, which will be connected to bonding terminals of a flexible printed circuit board, and ultrasonically bonding the flying leads and the bonding terminals together by applying ultrasonic vibration from the ultrasonic tool in a state where the flying leads are pressed onto the bonding terminals; and
   a step of covering the respective opposite surfaces of the flying leads that have been roughened by contact with the ultrasonic tool during the ultrasonic bonding with the thermally meltable metal that has been heated and melted to form a coating layer and thereby make the respective opposite surfaces smooth.

8. The method according to claim 7, wherein the thermally meltable metal is solder.

9. The method according to claim 7, wherein the bonding surfaces of the flying leads are made of gold.

* * * * *